(12) United States Patent
Miller et al.

(10) Patent No.: US 12,148,721 B2
(45) Date of Patent: Nov. 19, 2024

(54) ITERATIVE FORMATION OF DAMASCENE INTERCONNECTS

(71) Applicant: Raytheon Company, Waltham, MA (US)

(72) Inventors: Eric R. Miller, Orcutt, CA (US); Sean P. Kilcoyne, Lompoc, CA (US); Michael V. Liguori, Buellton, CA (US); Michael J. Rondon, Santa Rosa, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 17/871,215

(22) Filed: Jul. 22, 2022

(65) Prior Publication Data

US 2022/0359437 A1    Nov. 10, 2022

Related U.S. Application Data

(62) Division of application No. 16/923,332, filed on Jul. 8, 2020, now Pat. No. 11,430,753.

(51) Int. Cl.
*H01L 23/00* (2006.01)
*H01L 21/66* (2006.01)

(52) U.S. Cl.
CPC .............. *H01L 24/03* (2013.01); *H01L 22/20* (2013.01); *H01L 24/05* (2013.01); *H01L 24/08* (2013.01);
(Continued)

(58) Field of Classification Search
CPC .............. H01L 24/03; H01L 24/05; H01L 2224/03845
See application file for complete search history.

(56) References Cited

U.S. PATENT DOCUMENTS 6,368,939 B1 * 4/2002 Sasaki ............... H01L 21/76829
                                                          438/618
6,551,931 B1    4/2003 Edelstein et al.
(Continued)

FOREIGN PATENT DOCUMENTS

JP    2019512890 A    5/2019
WO     0120647 A2    3/2001

OTHER PUBLICATIONS

International Search Report and Written Opinion for PCT Application No. PCT/US2021/040306, dated Oct. 12, 2021, pp. 1-13.
(Continued)

*Primary Examiner* — Dale E Page
*Assistant Examiner* — Wilner Jean Baptiste
(74) *Attorney, Agent, or Firm* — CANTOR COLBURN LLP

(57) ABSTRACT

Interconnects and methods of fabricating a plurality of interconnects. The method includes depositing a conformal layer of a plating base in each of a plurality of vias, and depositing a photoresist on two portions of a surface of the plating base outside and above the plurality of vias. The method also includes depositing a plating metal over the plating base in each of the plurality of vias, the depositing resulting in each of the plurality of vias being completely filled or incompletely filled, performing a chemical mechanical planarization (CMP), and performing metrology to determine if any of the plurality of vias is incompletely filled following the depositing the plating metal. A second iteration of the depositing the plating metal over the plating base is performed in each of the plurality of vias based on determining that at least one of the plurality of vias is incompletely filled.

5 Claims, 6 Drawing Sheets

(52) U.S. Cl.
CPC ...... *H01L 24/83* (2013.01); *H01L 2224/0346* (2013.01); *H01L 2224/037* (2013.01); *H01L 2224/03845* (2013.01); *H01L 2224/03901* (2013.01); *H01L 2224/05546* (2013.01); *H01L 2224/05609* (2013.01); *H01L 2224/05644* (2013.01); *H01L 2224/05647* (2013.01); *H01L 2224/05655* (2013.01); *H01L 2224/08145* (2013.01); *H01L 2224/80895* (2013.01); *H01L 2224/83896* (2013.01)

(56) References Cited

U.S. PATENT DOCUMENTS

| | | | |
|---|---|---|---|
| 9,570,396 | B2 | 2/2017 | Enda |
| 9,704,907 | B1 | 7/2017 | Neumann et al. |
| 2002/0166773 | A1 | 11/2002 | Cohen |
| 2015/0243611 | A1* | 8/2015 | Liu .................. H01L 24/80 438/653 |
| 2017/0062366 | A1 | 3/2017 | Enquist |
| 2017/0133336 | A1 | 5/2017 | Oliver et al. |
| 2017/0271217 | A1 | 9/2017 | Kilcoyne et al. |
| 2018/0096858 | A1 | 4/2018 | Clevenger et al. |
| 2019/0252244 | A1* | 8/2019 | Kilcoyne ............... H05K 3/424 |
| 2020/0126906 | A1 | 4/2020 | Uzoh et al. |
| 2022/0013478 | A1 | 1/2022 | Miller et al. |

OTHER PUBLICATIONS

PCT Transmittal of International Preliminary Report on Patentabiltiy for PCT Application No. PCT/US2021/040306, dated Jan. 19, 2023, 9 pages.

* cited by examiner

ITERATIVE FORMATION OF DAMASCENE INTERCONNECTS

CROSS REFERENCE TO RELATED APPLICATION

This application is a division of U.S. application Ser. No. 16/923,332, filed Jul. 8, 2020, the disclosure of which is incorporated by reference herein in its entirety.

BACKGROUND

The present disclosure relates to damascene interconnects and, more particularly, to iterative formation of damascene interconnects.

An interconnect provides an electrical connection between two components. As one example, a direct bond hybridization interconnect directly connects two bonded wafers without intermediate layers and with embedded metal. A damascene process for forming interconnects refers to an additive process in which the interconnect metal is deposited and excess metal is removed by a chemical mechanical planarization (CMP).

SUMMARY

Disclosed herein are interconnects and methods of fabricating a plurality of interconnects. A non-limiting example of a method includes depositing a conformal layer of a plating base in each of a plurality of vias, and depositing a photoresist on two portions of a surface of the plating base outside and above the plurality of vias. The method also includes depositing a plating metal over the plating base in each of the plurality of vias, the depositing the plating metal resulting in each of the plurality of vias being completely filled or incompletely filled with the plating metal. The method further includes performing a chemical mechanical planarization (CMP), and performing metrology to determine if any of the plurality of vias is incompletely filled following the depositing the plating metal. A second iteration of the depositing the plating metal over the plating base is performed in each of the plurality of vias based on determining that at least one of the plurality of vias is incompletely filled.

Another non-limiting example of a plurality of interconnects includes a first set of final intermediate structures, a surface of each of the first set of final intermediate structures including a continuous layer of a plating metal formed according to an iterative fill process. The first set of final intermediate structures is formed on a first substrate. The plurality of interconnects also includes a second set of final intermediate structures, a surface of each of the second set of final intermediate structures including a continuous layer of the plating metal formed according to an iterative fill process. The second set of final intermediate structures is formed on a second substrate and the first set of final intermediate structures and the second set of final intermediate structures are aligned in opposite directions.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts:

FIGS. 1-10 illustrate results of processes involved in iterative formation of damascene interconnects according to one or more embodiments, in which:

FIG. 1 shows a contact metal etched on a substrate;

FIG. 2 shows a result of depositing a bonding oxide over the contact metal and substrate;

FIG. 3 shows the intermediate structures that result from etching a via in the bonding oxide and conformally depositing a plating base;

FIG. 4 shows the result of depositing photoresist on portions of the bonding oxide surface;

FIG. 5 shows intermediate structures with plating metal deposited in the vias;

FIG. 6 shows a result of a chemical mechanical planarization (CMP) process;

FIG. 7 shows the result of a second iteration of depositing the plating metal;

FIG. 8 shows a result of the CMP process for the second iteration;

FIG. 9 shows the intermediate structures that result from another CMP process following removal of the photoresist; and FIG. 10 shows exemplary interconnects formed according to one or more embodiments.

DETAILED DESCRIPTION

As previously noted, an interconnect bonds and electrically connects components such as wafers. A damascene process is an additive approach to forming interconnects. Embodiments of the systems and methods detailed herein relate to the iterative formation of damascene interconnects. Typically, a set of interconnects are formed simultaneously for a given wafer. Prior interconnects have included copper interconnects formed by the damascene process. When plating metals other than copper are used, they can plate with large grains that give rise to poor plating uniformity across the wafer. Use of the traditional damascene process with these plating metals can result in some of the interconnects having insufficient plating (i.e., incomplete fill of the via between the two components being interconnected), resulting in subsequent challenges such as at the CMP step that follows the plating. The iterative formation of damascene interconnects, according to one or more embodiments, ensures that every via is sufficiently filled prior to removal of the photoresist that protects the seed metal (i.e., plating base).

FIGS. 1-10 illustrate results of processes involved in iterative formation of damascene interconnects 1000*a*, 1000*b* (generally referred to as 1000) (FIG. 10) according to one or more embodiments. The formation of two interconnects 1000 over two iterations is shown in FIGS. 1-10. However, it should be understood that the processes discussed herein pertain to the simultaneous formation of any number of interconnects 1000 over any number of iterations.

Figure 1:
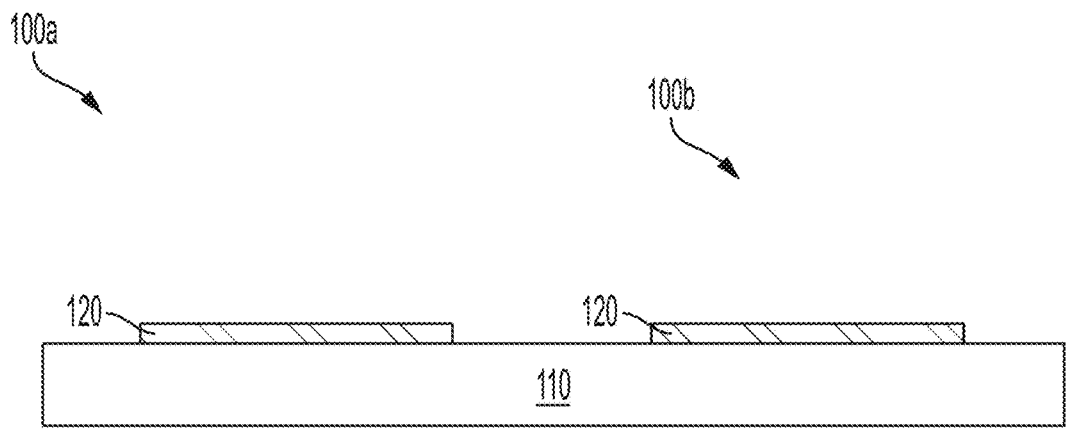
Figure 10:
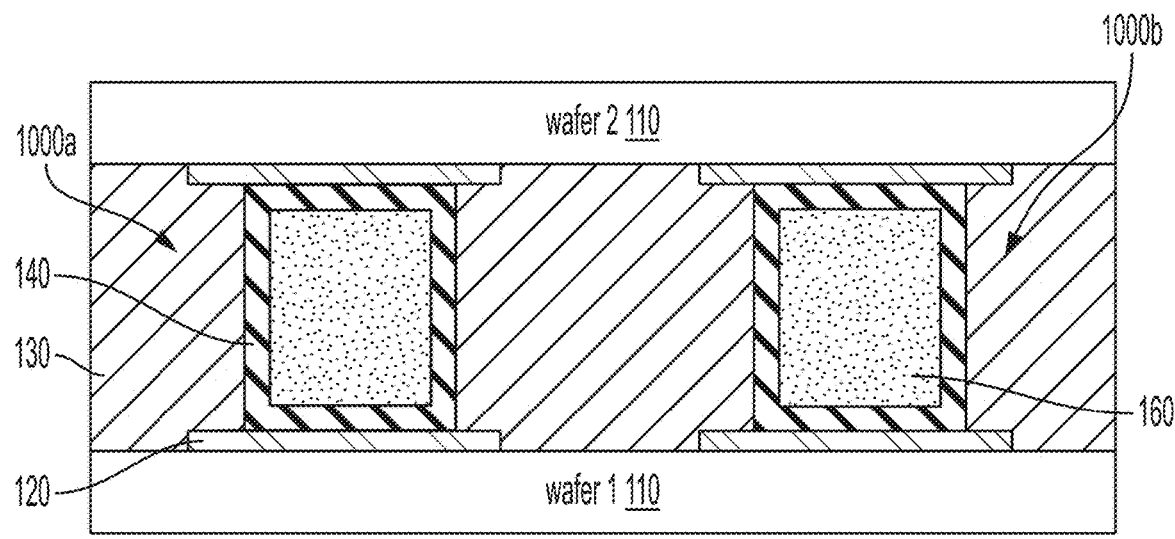

FIG. 1 shows intermediate structures 100*a*, 100*b* (generally referred to as 100) associated with the formation of two interconnects 1000 (FIG. 10). In each intermediate structure 100, a contact metal 120 is deposited on a substrate 110 (i.e., a wafer) and etched. The substrate 110 may be silicon, for example. The contact metal 120 may be selected according to the particular application and may be, for example, aluminum, niobium, or tantalum nitride.

Figure 2:
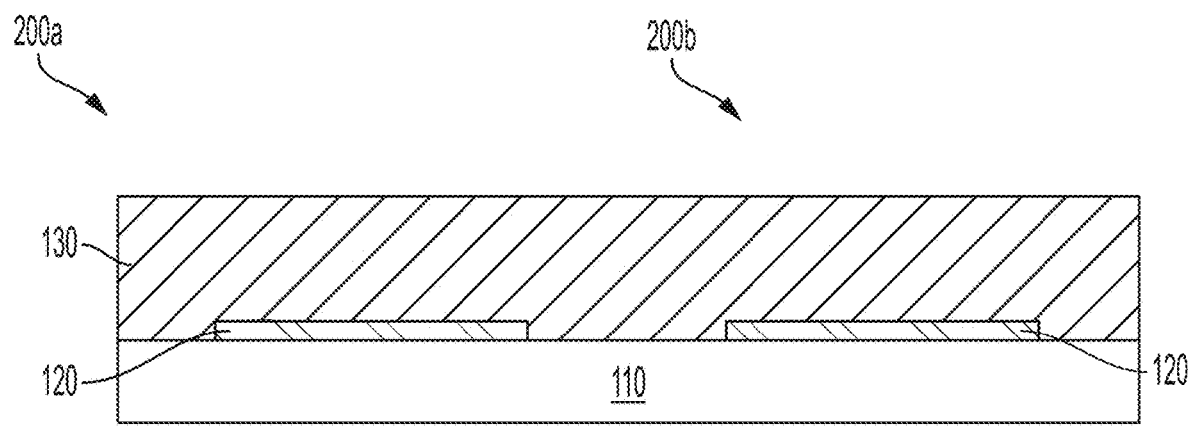

FIG. 2 shows intermediate structures 200a, 200b (generally referred to as 200) that include a bonding oxide 130 deposited over the intermediate structures 100 shown in FIG. 1. The bonding oxide 130 may be, silicon dioxide, for example.

Figure 3:
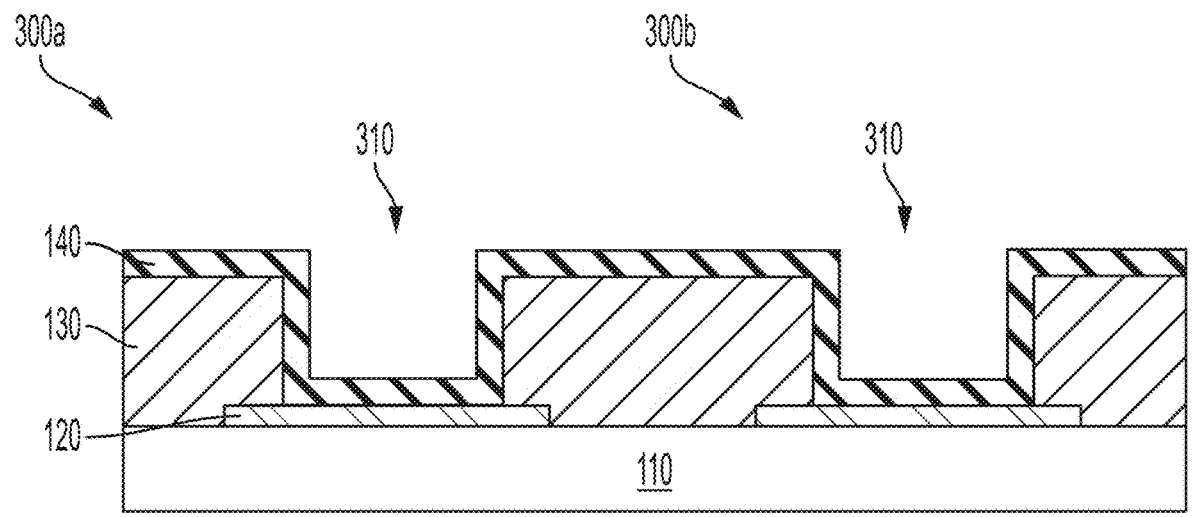

FIG. 3 shows intermediate structures 300a, 300b (generally referred to as 300). The intermediate structures 300 result from performing multiple processes on the intermediate structures 200 shown in FIG. 2. The bonding oxide 130 is etched to create a via 310 in each intermediate structure 300a, 300b. The etching process may be, for example, a wet chemical etching process using hydrofluoric acid (HF) or a dry chemical etching process using tetrafluoromethane (CF4) or trifluoromethane (CHF3). A plating base 140 is then conformally deposited over the entire structure, as shown. The plating base 140 may be tin or tantalum, for example.

Figure 4:
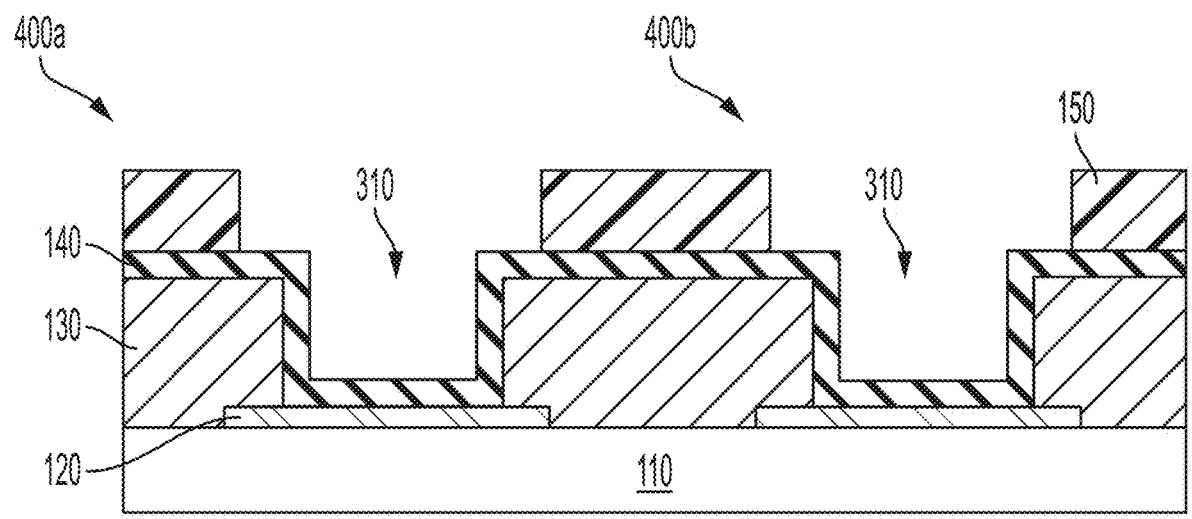

FIG. 4 shows intermediate structures 400a, 400b (generally referred to as 400) that result from deposition of photoresist 150 on the plating base 140, as shown. The use of the photoresist 150, which protects the plating base 140 below a during CMP process, facilitates iteratively filling the vias 310 according to one or more embodiments, as discussed with reference to FIG. 6.

Figure 5:
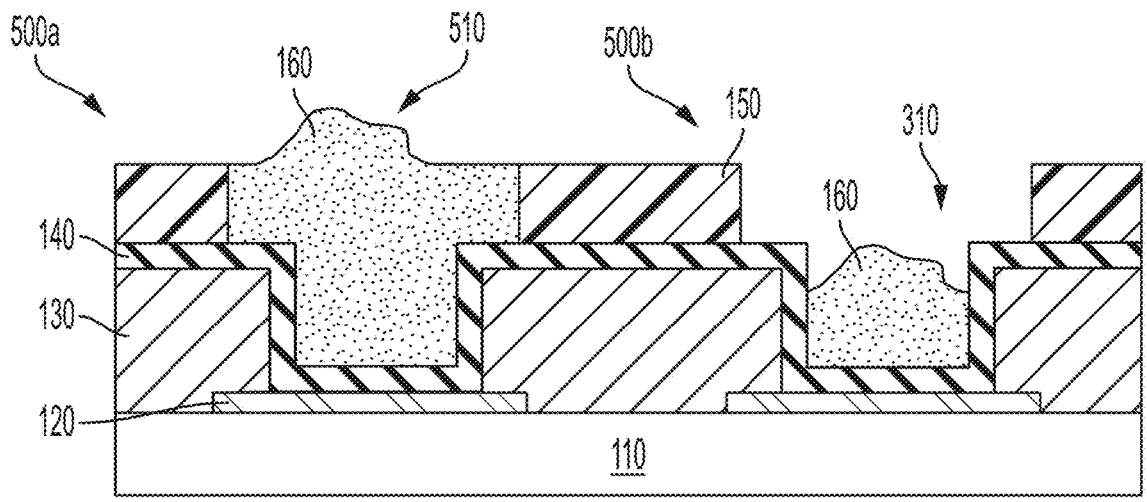

FIG. 5 shows intermediate structures 500a, 500b (generally referred to as 500) and the first iteration of filling the vias 310. A plating metal 160 is deposited over the plating base 140. The deposition is in the vias 310 of every intermediate structure 400 and, in at least some cases (e.g., in intermediate structure 400a) on the exposed surfaces of the plating base 140. The plating metal 160 may be indium, copper, gold, or nickel, for example. The intermediate structure 500a shows the ideal result of this deposition. Plating metal 160 not only fills the via 310 but an overburden 510 (i.e., a portion above a top level of the photoresist 150) results, as well. The intermediate structure 500b shows the issue that may result and that led to the iterative process according to one or more embodiments. The deposition of the plating metal 160 resulted in incomplete fill of the via 310. According to the prior damascene processing, the deposition and resulting insufficient fill would be the end result. As previously noted, according to one or more embodiments, the use of the photoresist 150 to protect the plating base 140 facilitates an iterative plating process as discussed with reference to FIG. 6.

Figure 6:
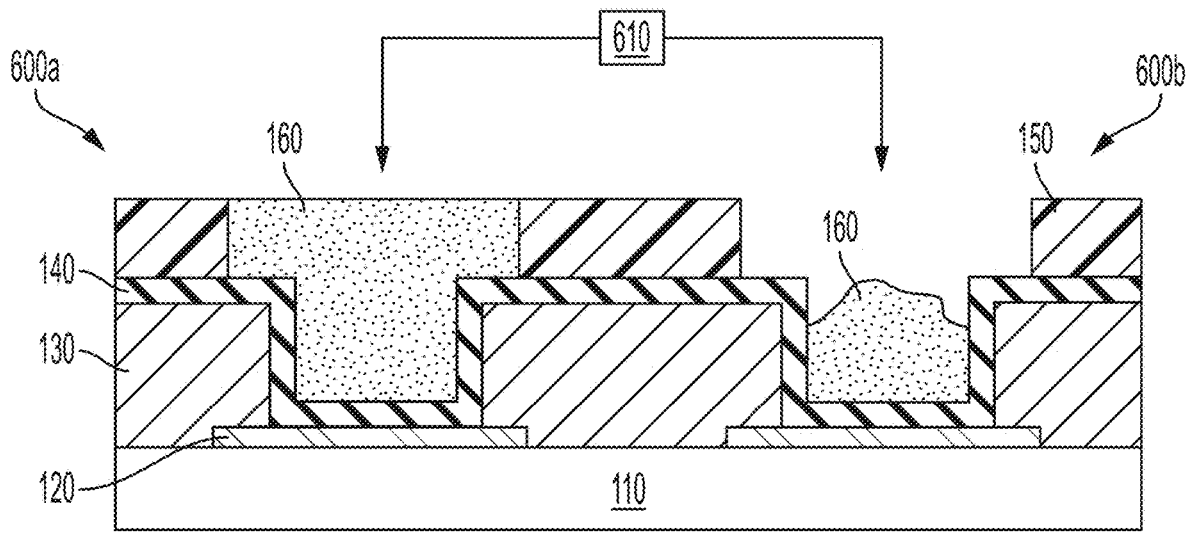

FIG. 6 shows intermediate structures 600a, 600b (generally referred to as 600). The intermediate structures 600 show the result of performing a CMP process on the intermediate structures 500 shown in FIG. 5. In the case of the intermediate structure 500a, the overburden 510 would be polished or planarized to result in the intermediate structure 600a, which is the desired result. However, in the case of the intermediate structure 500b, which had incomplete fill, the intermediate structure 600b is essentially unchanged from the intermediate structure 500b based on the CMP process.

According to one or more embodiments, the photoresist 150 is retained to facilitate another iteration of deposition of the plating metal 160 based on the insufficient fill for the intermediate structure 600b. Insufficient fill is determined based on performing metrology on all the intermediate structures 600 (i.e., two in the exemplary case) at this stage. Metrology may involve a visual inspection of the fill for each via 310 by an individual or a tool (e.g., camera and image processing), atomic force microscopy (AFM), surface profilometry, or a scanning interferometer that calculates the fill of each via 310, for example. Thus, the metrology device 610 shown in FIG. 6 may be a camera and image processor, an AFM, a surface profilometer, or a scanning interferometer, for example.

Figure 7:
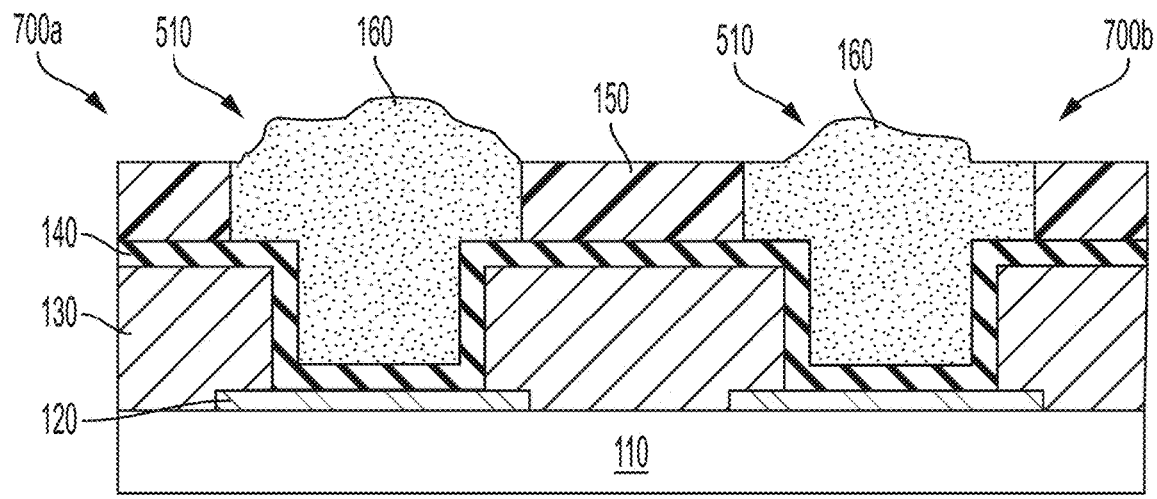

FIG. 7 shows intermediate structures 700a, 700b (generally referred to as 700). According to one or more embodiments, the intermediate structures 700 result from a second iteration of depositing plating metal 160 in the intermediate structures 600 shown in FIG. 6. This second iteration is performed based on the result of performing metrology on all the intermediate structures 600. In the case of intermediate structure 600a, this second deposition is not necessary and once again results in an overburden 510. However, in the case of the intermediate structure 600b, which evidenced incomplete fill, this second deposition results in an overburden 510 for the first time. While an exemplary case of the intermediate structure 600b being filled after the second iteration of plating is illustrated, further iterations may be necessary to fill the via 310 of the intermediate structure 600b.

Figure 8:
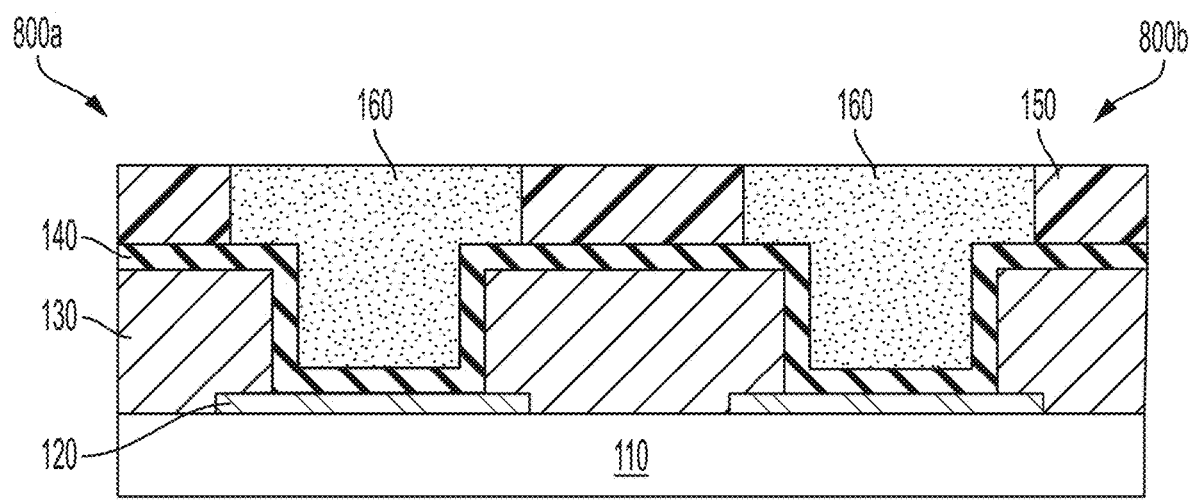

FIG. 8 shows intermediate structures 800a, 800b (generally referred to as 800). The intermediate structures 800 result from performing a CMP while retaining the photoresist 150. The CMP results in the overburden 510 in both intermediate structures 700a, 700b being removed, as shown. As a comparison of FIG. 6 to FIG. 8 indicates, the intermediate structure 600a is the same as the intermediate structure 800a. If all the intermediate structure 600 were in the condition of intermediate structure 600a, the second iteration of depositing the plating metal 160 would not have been performed. However, until all the intermediate structures 600 look like the intermediate structure 600a, the processes discussed with reference to FIGS. 7 and 8 (i.e., redeposition of plating metal 160 and CMP while retaining the photoresist 150) are repeated. The number of repetitions or iterations is determined by the result of metrology performed after each CMP process (e.g., after the processes whose results are illustrated in FIGS. 6 and 8).

Figure 9:
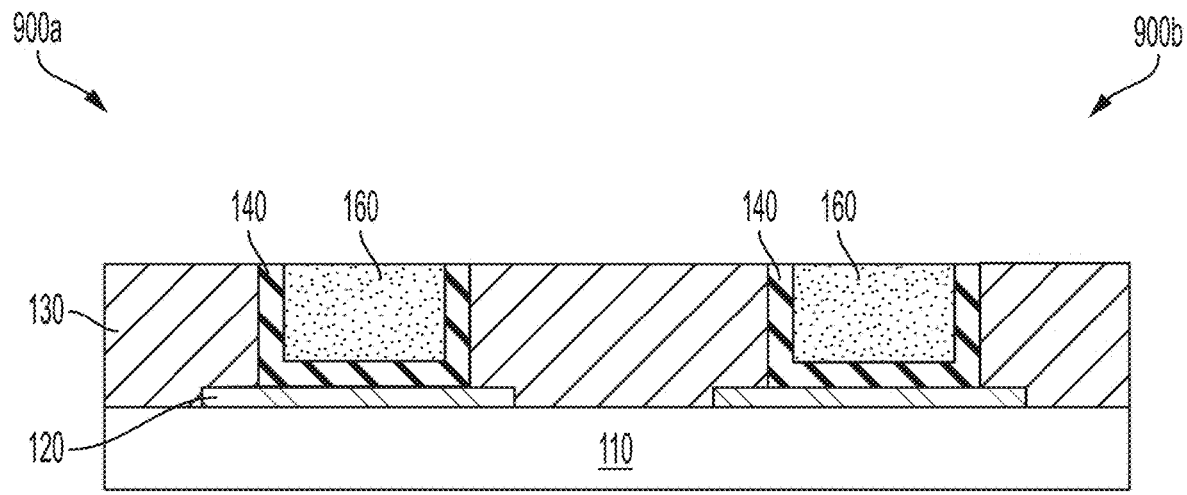

FIG. 9 shows intermediate structures 900a, 900b (generally referred to as 900). The processes that result in the intermediate structures 900 are only performed after the results illustrated in FIG. 8 are achieved. That is, for more than two and any number of interconnects 1000, the processes discussed herein are only performed after every intermediate structure 800 looks like those shown in FIG. 8. Specifically, the photoresist 150 is removed first. A solvent soak or a dry ash removal, for example, may be used to remove the photoresist 150. Then another CMP is performed to expose the surface of the bonding oxide 130, as shown. That is, the further CMP results in the planarization of the plating metal 160 and the plating base 140 above the surface of the bonding oxide 130, as shown.

FIG. 10 shows exemplary interconnects 1000a, 1000b (generally referred to as 1000) that are formed according to the processes discussed with reference to FIGS. 1-9. As shown, one set of intermediate structures 900, which can be regarded as final intermediate structures, formed on a first substrate 110 (i.e., wafer 1) are aligned and connected with another set of intermediate structures 900 (i.e., another set of final intermediate structures) formed on a second substrate 110 (i.e., wafer 2). The plating metal 160 of corresponding intermediate structures 900 is aligned to create a bond. As FIG. 10 indicates, each interconnect is formed between two substrates 110 or wafers. Thus, the two sets of final intermediate structures 900 are aligned in opposite directions (i.e., each is upside down as compared with the other).

Figure 11:
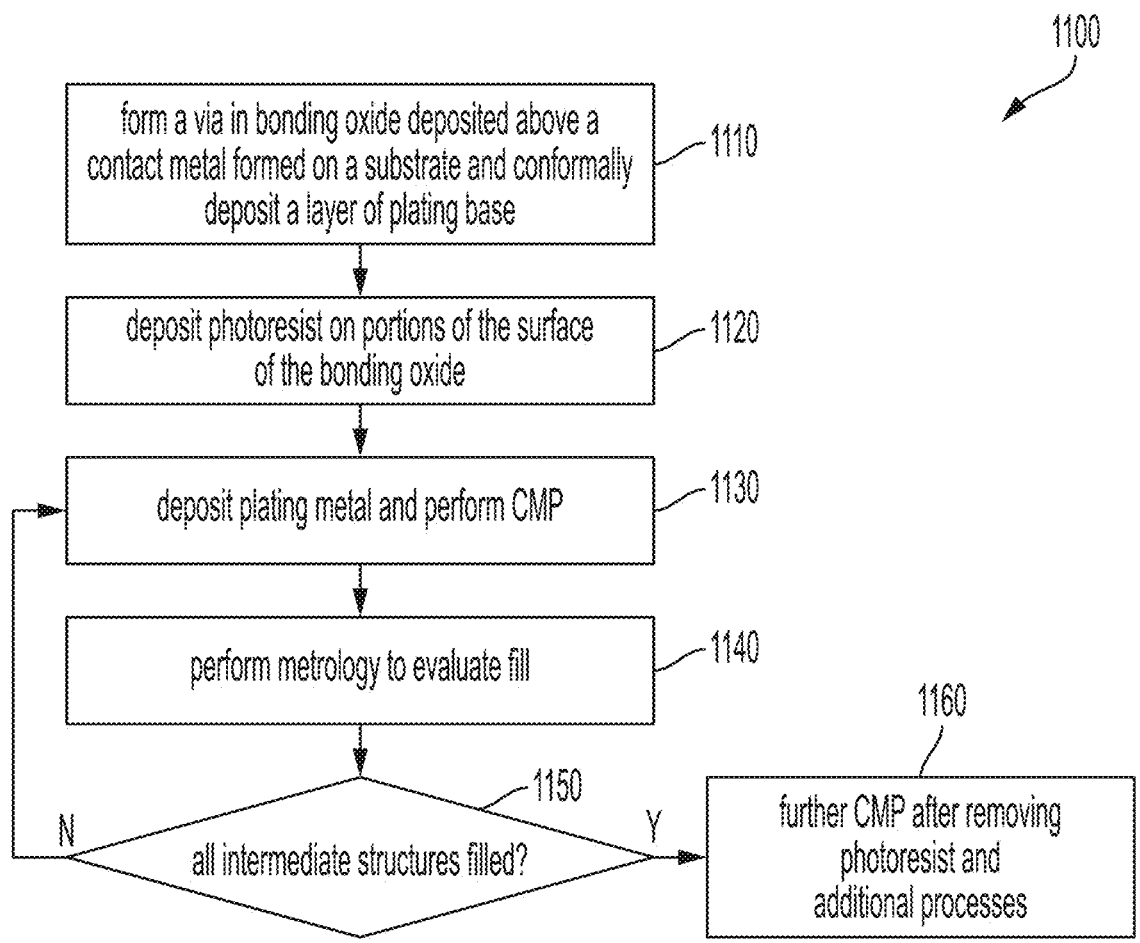
FIG. 11 is a process flow of a method of iteratively forming damascene interconnects.

FIG. 11 is a process flow of a method 1100 of iteratively forming damascene interconnects 1000 according to one or more embodiments. At block 1110, forming a via 310 in bonding oxide 130 that is deposited above a contact metal 120 formed on a substrate 110 and conformally depositing a layer of plating base 140 refers to fabricating the intermediate structures 300 shown in FIG. 3. At block 1120, depositing photoresist 150 on portions of the surface of the bonding oxide 130 refers to generating the intermediate structures 400 shown in FIG. 4. At block 1130, depositing plating metal 160 and performing CMP will result in intermediate structures 600 like those shown in FIG. 6 but may result in intermediate structures 800 like those shown in FIG. 8. That is, one or more of the vias 310 may have incomplete fill but it is possible that none of the vias 310 exhibit incomplete fill following the processes at block 1130 in the first iteration.

At this stage, performing metrology to evaluate fill, at block 1140, indicates whether all the vias 310 are filled like those in intermediate structures 800 or if one or more vias 310 exhibit incomplete fill like intermediate structure 600b. At block 1150, a check is done of whether all the intermediate structures 600/800 are filled. If they are not, as is the case for intermediate structures 600, then another iteration is started with the deposition at block 1130. If, instead, the check at block 1150 indicates that all the intermediate structures 800 are filled, as is the case shown in FIG. 8, then the processes at block 1160 are completed. The processes at block 1160 begin with a further CMP after removing the photoresist 150. This results in the intermediate structures 900. Then, the additional processes discussed with reference to FIG. 10 are performed to generate the interconnects 1000. Specifically, corresponding intermediate structures 900 formed on two different substrates 110 are aligned and connected, as shown in FIG. 10.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A plurality of interconnects comprising:
   a first set of final intermediate structures, a surface of each of the first set of final intermediate structures including plating base filled with a continuous layer of a plating metal formed according to an iterative fill process, wherein the first set of final intermediate structures is formed on a first substrate; and
   a second set of final intermediate structures, a surface of each of the second set of final intermediate structures including a plating base filled with a continuous layer of the plating metal formed according to an iterative fill process, wherein the second set of final intermediate structures is formed on a second substrate and the first set of final intermediate structures and the second set of final intermediate structures are aligned in opposite directions;
   wherein the plating metal of the first set of final intermediate structures are joined with the plating metal of the second set of the final intermediate structures to form the interconnects.

2. The plurality of interconnects according to claim 1, wherein the plating metal of each of the first set of final intermediate structures and the plating metal of each of the second set of final intermediate structures is formed on a conformal layer of a plating base.

3. The plurality of interconnects according to claim 1, wherein bonding oxide separates the plurality of interconnects.

4. The plurality of interconnects according to claim 1, wherein the plating metal is indium.

5. The plurality of interconnects according to claim 1, wherein the plating metal is copper, gold, or nickel.

* * * * *